US009803065B2

(12) United States Patent
Al-Ghamdi et al.

(10) Patent No.: US 9,803,065 B2
(45) Date of Patent: Oct. 31, 2017

(54) MICROWAVE SHIELDING EFFECTIVENESS BASED ON POLYVINYL ALCOHOL/SILVER HYBRID NANOCOMPOSITES

(71) Applicant: King Abdulaziz University, Jeddah (SA)

(72) Inventors: Ahmed A. Al-Ghamdi, Jeddah (SA); Yusuf Al-Turki, Jeddah (SA); Fahrettin Yakuphanoglu, Elazig (TR); Farid El-Tantawy, Ismailia (EG)

(73) Assignee: King Abdulaziz University, Jeddah (SA)

( * ) Notice: Subject to any disclaimer, the term of this patent is extended or adjusted under 35 U.S.C. 154(b) by 91 days.

(21) Appl. No.: 14/789,692

(22) Filed: Jul. 1, 2015

(65) Prior Publication Data

US 2016/0264762 A1    Sep. 15, 2016

Related U.S. Application Data

(60) Provisional application No. 62/132,346, filed on Mar. 12, 2015.

(51) Int. Cl.
| | |
|---|---|
| *C08K 7/00* | (2006.01) |
| *H05K 9/00* | (2006.01) |
| *C08J 5/18* | (2006.01) |
| *C08J 3/20* | (2006.01) |
| *C08J 3/28* | (2006.01) |
| *C08K 3/08* | (2006.01) |

(52) U.S. Cl.
CPC ............ *C08K 7/00* (2013.01); *C08J 3/203* (2013.01); *C08J 3/28* (2013.01); *C08J 5/18* (2013.01); *H05K 9/0007* (2013.01); *C08J 2329/04* (2013.01); *C08K 2003/0806* (2013.01); *C08K 2201/001* (2013.01); *C08K 2201/011* (2013.01)

(58) Field of Classification Search
None
See application file for complete search history.

(56) References Cited

U.S. PATENT DOCUMENTS

| | | | |
|---|---|---|---|
| 4,471,015 | A | 9/1984 | Ebneth et al. |
| 4,948,922 | A | 8/1990 | Varadan et al. |
| (Continued) | | | |

FOREIGN PATENT DOCUMENTS

| | | |
|---|---|---|
| KR | 10-2008-0112624 | 12/2008 |
| KR | 10-1076328 | 10/2011 |

OTHER PUBLICATIONS

Ramesh, G.V., et al., "Microwave Absorber Based on Silver Nanoparticle-Embedded Polymer Thin Film", Journal of Nanoscience and Nanotechnology, vol. 9, No. 1, pp. 261-266, (Jan. 2009).

(Continued)

*Primary Examiner* — Joseph D Anthony
(74) *Attorney, Agent, or Firm* — Oblon, McClelland, Maier & Neustadt, L.L.P.

(57) ABSTRACT

A composite material for electromagnetic interference shielding is provided. The composite material comprises a polymer matrix with metal nanoparticles dispersed within the matrix. Methods of characterizing the nanocomposites are provided and demonstrate commercially relevant mechanical and electrical properties, particularly an electromagnetic interference shielding effectiveness in the microwave frequency. An economical process for preparing the nanocomposites is also provided.

12 Claims, 12 Drawing Sheets

(56) References Cited

U.S. PATENT DOCUMENTS

| | | | |
|---|---|---|---|
| 5,689,878 | A | 11/1997 | Dahringer et al. |
| 8,520,406 | B2 | 8/2013 | Liang et al. |
| 2003/0059820 | A1* | 3/2003 | Vo-Dinh ............... B01J 19/0046 506/3 |
| 2008/0213609 | A1* | 9/2008 | Jablonski ............. B05D 3/0254 428/546 |
| 2013/0056688 | A1* | 3/2013 | Lin ......................... B05D 5/12 252/514 |
| 2013/0177504 | A1* | 7/2013 | Macoviak ................ A61K 8/29 424/10.3 |
| 2014/0065387 | A1* | 3/2014 | Andre .................... C09D 11/03 428/209 |
| 2014/0205546 | A1* | 7/2014 | Macoviak ................ A61K 8/29 424/10.3 |
| 2015/0159029 | A1* | 6/2015 | Andre ..................... C09D 5/24 427/256 |

OTHER PUBLICATIONS

Al-Ghamdi, A. A., et al., "Novel polyvinyl alcohol/silver hybrid nanocomposites for high performance electromagnetic wave shielding effectiveness", Microsystems Technologies, vol. 21, Issue 4, Total 10 Pages, (Apr. 2015).

Kim, Hae-Rim, et al., "Lightweight nanofibrous EMI shielding nanowebs prepared by electrospinning and metallization", Composites Science and Technology, vol. 72, Issue 11, pp. 1233-1239, (Jun. 28, 2012).

\* cited by examiner

MICROWAVE SHIELDING EFFECTIVENESS BASED ON POLYVINYL ALCOHOL/SILVER HYBRID NANOCOMPOSITES

CROSS REFERENCE TO RELATED APPLICATIONS

This application claims the benefit of priority from U.S. Provisional Application No. 62/132,346 filed Mar. 12, 2015, the entire contents of which are herein incorporated by reference.

BACKGROUND OF THE INVENTION

Technical Field

The present invention relates generally to the field of electromagnetic shielding materials and coatings. More particularly, the present invention relates to polymer nanocomposites suitable for microwave shielding effectiveness and the economic preparation of such nanocomposites.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

With the proliferation of more powerful and compact electronic products, electromagnetic interference (EMI) is becoming a significant factor in critical electronic devices. The growth in the application of electronic devices, specifically utilizing microwave frequencies from 300 MHz to 300 GHz, across a broad spectrum of military, industrial, commercial and consumer sectors has created the need for effective shielding materials against EMI. Materials with the capability of absorbing electromagnetic signals are needed in all fields. The EMI shielding of electronic devices and/or radiation sources may be a consideration in the reliable and secure operation of devices, and in preventing possible human health risks.

For efficient shielding action, shielding effectiveness (SE), the material or coating should possess either mobile charge carriers (electrons or holes) or electric and/or magnetic dipoles which interact with the electric (E) and magnetic (H) vectors of the incident EM radiation.

Metals are by far the most common materials for EMI shielding owing to their high electrical conductivity. However, metal shields have the inconvenience of poor mechanical flexibility, exceedingly high weight, propensity to corrosion, and limited tuning of the SE.

Among other alternatives, carbon based materials (graphite, expanded graphite, carbon black, carbon nanotubes and graphene) have also been widely explored for possible application in EMI shielding. However, graphite exhibits poor dispersibility and a high peroclation threshold. Similarly, carbon nanotubes are economically non-viable, difficult to produce at bulk scale and often require purification, auxiliary treatment and fucntionalization steps.

The synthesis of hybrid filler materials based on various combinations of polymers, carbon based materials and/or dielectric/magnetic nanoparticles may be a solution. Polymer nanocomposites represent a novel class of materials that possess a unique combination of electrical, thermal, dielectric, magnetic and/or mechanical properties which are useful for the suppression of electromagnetic noises. The introduction of electrical conductivity to various polymer matrices compensates for the drawbacks of metals and carbon based fillers.

In view of the foregoing, it will be advantageous to provide improvements in EMI shielding structures having nanofillers. In particular, it would be desirable to provide improved EMI shielding structures that may be produced in a relatively lightweight form and at a relatively low cost. It also would be desirable to provide improved methods for producing EMI shielding structures that include nanofillers. Therefore, it would be desirable to improve further the SE as well as mechanical properties of conducting polymer based composites and attain a shielding material that can satisfy relevant techno commercial specifications and maintain process economics at the same time. Disclosed embodiments of the present invention overcome the shortcomings of the prior art as described herein.

BRIEF SUMMARY OF THE INVENTION

The foregoing paragraphs have been provided by way of general introduction, and are not intended to limit the scope of the following claims. The described embodiments, together with further advantages, will be best understood by reference to the following detailed description taken in conjunction with the accompanying drawings.

In a first aspect, the present invention relates to nanocomposite shielding materials for adsorption of electromagnetic radiation comprising a polymer matrix with metal nanoparticles dispersed throughout the matrix. In a preferred embodiment, the nanocomposite shielding material is particularly focused on absorbing electromagnetic radiation with a frequency in the range of 1-12 GHz, the polymer is polyvinyl alcohol and the metal is silver. The nanocomposite shielding material described offers a total electromagnetic shielding effectiveness, the sum of the absorption loss and the reflection loss of at least 6 dB and preferably 6-85 dB.

The metal nanoparticles possess an average crystalline size of 10-15 nm. They are present in the form of nanoplatelets having a thickness of 4-8 nm and an average edge length of 2-8 µm. The metal nanoplatelets are present in the composition at 1-10% weight relative to the total weight of the nanocomposite shielding material. The metal nanoparticles are present and dispersed throughout the polymer matrix in a manner to be sufficient to form seamlessly interconnected infinite conductive networks with a separation of no more than 100 µm.

The presence of the metal nanoparticles imparts significant mechanical properties to the nanocomposite material. The nanocomposite shielding material demonstrates a tensile strength of 20-50 MPa, a Young's modulus of 2-30 MPa, a hardness shore A of 30-70 MPa and an elongation at break of 5-90% as a function of metal loading.

The presence of the metal nanoparticles further imparts significant electrical properties to the nanocomposite material. The nanocomposite shielding material demonstrates a conductivity of $10^{-14}$-$10^4$ ohm$^{-1}$cm$^{-1}$ and a percolation threshold of 1.0-2.0% weight metal while possessing a dielectric constant of 1-85. Functionally, the nanocomposite shielding material has an electromagnetic absorption loss of 5-65 dB and an electromagnetic reflection loss of 1-20 dB.

In a second aspect, the present invention relates to a process for forming the nancomposite shielding material described above. The process is a simple, mild, efficient, economical and environmentally benign methodology for the fabrication of the metal nanoparticle-embedded polymer films through the chemical and thermal reduction of metal ions inside a solid polymer matrix.

Characteristics of the metal salt as metal source, the polymer, the reducing agent and production conditions are the experimental parameters that allow control of the size, shape, density and dispersion of the nanoparticles inside the polymer matrix. The loading of metal relative to the total weight of the nanocomposite allows control of the mechanical and electrical properties. In a preferred embodiment the polymer is polyvinyl alcohol, the metal is silver sourced from $AgNO_3$, the reducing agent is β-D-glucose and the silver nanoparticles are present in 1-10% weight relative to the total nanocomposite.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
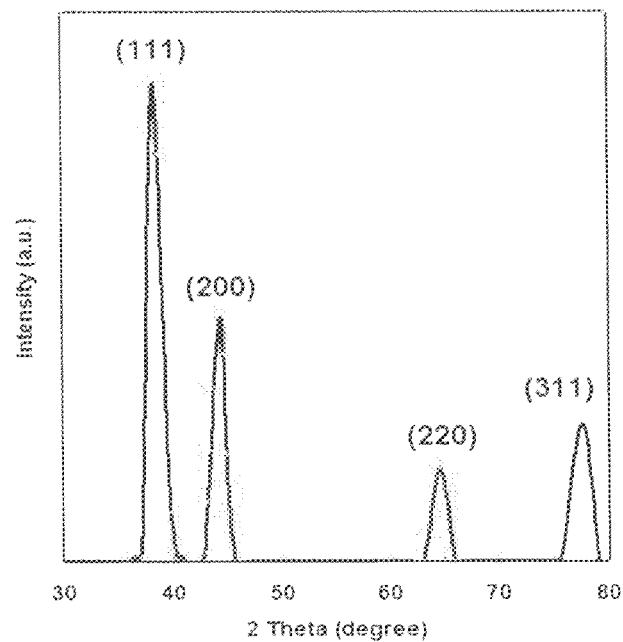
FIG. 1 is a X-ray diffraction pattern of as synthesized silver nanoparticles.

Referring now to the drawings, wherein like reference numerals designate identical or corresponding parts throughout the several views.

The present invention is directed to materials and coatings for reducing incident reflections and absorptions of microwave frequency electromagnetic energy and thus electromagnetic interference (EMI) shielding applications.

In a first aspect, the present invention relates to a nanocomposite shielding material comprising a polymer matrix with metal nanoparticles dispersed in the matrix. The material is envisioned to act as a shield against electromagnetic interference, preferably from electromagnetic radiation in the microwave frequency range.

Electromagnetic radiation (EM radiation or EMR) is a form of radiant energy released by certain electromagnetic processes. Classically, EMR consists of electromagnetic waves, which are synchronized oscillations of electric and magnetic fields that propagate at the speed of light. Electromagnetic (EM) waves are produced whenever charged particles are accelerated, and these waves can subsequently interact with any charged particles. Electromagnetic radiation is associated with those EM waves that are free to propagate themselves (radiate) without the continuing influence of the moving charges that produced them.

For the purposes of the present invention, microwaves are a form of electromagnetic radiation with wavelengths ranging from 1000-1 mm and frequencies between 0.3 GHz and 300 GHz. In broad definition this includes both ultra-high frequency (UHF) and extremely high frequency (EHF) bands as well as the entire super high frequency (SHF) bands and their allocations. Microwave technology is used extensively. Sources of microwave frequency electromagnetic radiation include telecommunication, broadcasting, navigation, radar, radio astronomy, spectroscopy, heating and power applications.

The Radio Society of Great Britain (RSGB) designates the following non-limiting uses and microwave frequency bands: L band (1-2 GHz, military telemetry, GPS, mobile phones, amateur radio), S band (2-4 GHz, weather radar, surface ship radar, some communications satellites, microwave ovens, microwave devices/communications, radio astronomy, mobile phones, wireless LAN, Bluetooth, ZigBee, GPS, amateur radio), C band (4-8 GHz, long-distance radio telecommunications) and X band (8-12 GHz, satellite communications, radar, terrestrial broadband, space communications, amateur radio).

For the purposes of this specification, microwave frequencies mean electromagnetic wave frequencies between 300 MHz and 300 GHz. In a preferred embodiment of the invention, particular attention is paid to those below 100 GHz, more preferably those below 50 GHz and most preferably those below 20 GHz in the range of 1-12 GHz.

At microwave frequencies, EMR interacts with matter largely as a bulk collection of charges which are spread out over large numbers of affected atoms. In electrical conductors, such induced bulk movement of charges, electric currents, results in absorption of the EMR, or else separation of charges that cause generation of new EMR, reflection of the EMR. These interactions may produce either electric currents or heat.

As used herein, electromagnetic interference (EMI) is disturbance that affects an electrical circuit due to either electromagnetic radiation or electromagnetic induction. The disturbance may interrupt, obstruct, or otherwise degrade or limit the effective performance of the circuit. The source may be any object, artificial or natural, that carries rapidly changing electrical currents. EMI can be intentionally used (electronic warfare, radio jamming) or occur unintentionally, as a result of spurious emissions (intermodulation).

All electromagnetic waves consist of two essential components, a magnetic field (H) and electric field (E). These two fields are perpendicular to each other and the direction of wave propagation is at right angles to the plane containing the two components. Electromagnetic shielding materials are evaluated for their shielding effectiveness (SE). Shielding effectiveness is the ratio of the impinging energy to the residual energy, which is generally determined by two mechanisms: reflection ($SE_R$) and absorption ($SE_A$) of electromagnetic signals.

Electromagnetic shielding is the practice of reducing the electromagnetic field in a space by blocking the field with barriers made of conductive or magnetic materials. Shielding is typically applied to enclosures to isolate electrical devices and to cables to isolate wires from the environment through which the cable runs. The shielding can reduce the coupling of electromagnetic waves, electromagnetic fields and electrostatic fields. The amount of reduction depends very much upon the material used, its thickness, the size of the shielded volume and the frequency of the fields of interest. Also important are the size, shape and orientation of apertures in a shield to an incident electromagnetic field.

Electromagnetic radiation consists of coupled electric and magnetic fields. The electric field produces forces on the charge carriers (electrons) within the conductor. As soon as an electric field is applied to the surface of an ideal conductor, it induces a current that cause displacement of charge inside the conductor that cancels the applied field inside, at which point the current stops. Similarly, varying magnetic fields generate eddy currents that act to cancel the applied magnetic field. The result is that electromagnetic radiation is reflected from the surface of the conductor Many factors limit the shielding capability of shielding materials. Due to the electrical resistance of the conductor, the excited field does not completely cancel the incident field. Often, with high frequency electromagnetic radiation, at microwave frequencies, radiation energy that is not reflected is absorbed by the skin. A measure of the depth to which radiation can penetrate the shield is termed the skin depth.

An EMI shield is essentially a barrier to regulate the transmission of the electromagnetic wave across its bulk. In power electronics, the term shield refers to an enclosure that completely encloses an electronic product or a portion of that product and prevents the EM emission from an outside source from deteriorating its electronic performance. Conversely, it may also be used to prevent an external susceptible (electronic items or living organisms) from internal emissions of an instrument's electronic circuitry.

For purposes of the present invention, the term composite refers to a combination of two or more distinct constituent materials into one. The individual components, on an atomic level, remain separate and distinct within the finished structure. The materials may have different physical or chemical properties, that when combined, produce a material with characteristics different from the individual components.

A composite is understood to consist of a bulk phase, termed the matrix, enclosing a reinforcing phase, termed the reinforcement.

As used herein, a nanocomposite is a multiphase solid material composite where one of the phases has one, two or three dimensions of less than 100 nanometers, or structures having nano-scale repeat distances between the different phases that make up the material. In the broadest sense this definition can include porous media, colloids, gels and copolymers, but is more usually taken to mean the solid combination of a bulk matrix and one or more nanodimensional reinforcing phases differing in properties due to dissimilarities in structure and chemistry. In general, the mechanical, electrical, thermal, optical, electrochemical and catalytic properties of the nanocomposite will differ from that of the component materials.

Nanocomposites differ from conventional composite materials due to the exceptionally high surface to volume ratio of the reinforcing phase and/or its exceptionally high aspect ratio. The aspect ratio of a nanomaterial is defined as the length of the major (long) axis divided by the width of the minor (short) axis. The reinforcing phase can be made up of particles, sheets or fibers. The area of the interface between the matrix and reinforcement phase or phases is typically an order of magnitude greater than for conventional composite materials.

In terms of the present disclosure, polymer nanocomposites belong to the category of multi-phase systems and consist of a polymer or copolymer having nanoparticles or nanofillers dispersed in the polymer matrix. These may be of different shape and comprise particles, sheets or fibers, but at least one dimension must be in the range of less than 100 nm.

A range of polymeric nanocomposites are used for a wide variety of applications. As a result of the unique interactions between polymer and nanoparticles, a range of property combinations can be engineered to specific structure and properties. A range of natural and synthetic polymers are used to design polymeric nanocomposites for applications including, but not limited to, starch, cellulose, alginate, chitosan, collagen, gelatin, and fibrin, polyvinyl alcohol (PVA), polyethylene glycol (PEG), polycapro lactone (PCL) poly (lactic-co-glycolic acid) (PLGA) and polyglycerol sebacate (PGS). A range of nanoparticles including, but not limited to, ceramic, polymeric, metal oxide and carbon-based nanomaterials are incorporated with a polymeric network to obtain desired property combinations.

Appropriately adding nanoparticulates to a polymer matrix can enhance its performance, often dramatically, by simply capitalizing on the nature and properties of the nanoscale filler (nanofilled polymer composites). This strategy is particularly effective in yielding high performance composites, when good dispersion of the filler is achieved and the properties of the nanoscale filler are substantially different or better than those of the matrix.

Nanoscale dispersion of filler or controlled nanostructures in the composite can introduce new physical properties and novel behaviors that are absent in the unfilled matrices. This effectively changes the nature of the original matrix (such composite materials can better be described as genuine nanocomposites or hybrids). Some examples of new properties include fire resistance and accelerated biodegradability.

In a first aspect, the present invention relates to a nanocomposite shielding material comprising a polymer matrix, preferably polyvinyl alcohol, with metal nanoparticles, preferably silver nanoplatelets, dispersed in the matrix. The material is envisioned to act as a shield against electromagnetic interference, preferably from electromagnetic radiation in the microwave frequency range.

In a preferred embodiment the nanocomposite shielding material comprises a polymer matrix. In a more preferred embodiment the nanocomposite shielding material comprises a polyvinyl alcohol-based or copolymers and/or blends thereof polymer matrix. In a most preferred embodiment the nanocomposite shielding material comprises a polyvinyl alcohol or copolymer and/or blends thereof polymer matrix.

In a preferred embodiment, the polymer matrix is polyvinyl alcohol (PVA).

Polyvinyl alcohol (PVA, PVOH, or PVAl) is a water-soluble synthetic polymer. It has the idealized formula $[CH_2CH(OH)]_n$. It is white (colorless) and odorless. It can be supplied as beads or as solutions in water. Polyvinyl alcohol has excellent film forming, emulsifying and adhesive properties. It is also resistant to oil, grease and solvents. It has high tensile strength and flexibility.

Polyvinyl alcohol (PVA) has a relatively simple chemical structure with a pendant hydroxyl group. Unlike most vinyl polymers, PVA is not prepared by polymerization of the corresponding monomer. The monomer, vinyl alcohol, does not exist in a stable form rearranging to its tautomer, acetaldehyde. PVA instead is prepared by the polymerization of vinyl acetate to polyvinyl acetate (PVAc), followed by hydrolysis of PVAc to PVA. Other precursor polymers are sometimes used, with formate or chloracteate groups instead of acetate. The conversion of the polyesters is usually conducted by base-catalyzed transesterification with ethanol. The hydrolysis reaction does not go to completion resulting in polymers with a certain degree of hydrolysis that depends on the extent of the reaction. In essence, PVA is always a copolymer of PVA and PVAc.

Polyvinyl alcohol is an atactic material, defined as a macromolecule where the substituents are placed randomly along the chain. The percentage of meso diads is between 1 and 99%. PVA exhibits crystallinity, defined as a solid material whose constituents, such as atoms, molecules or ions, are arranged in a highly ordered microscopic structure forming a crystal lattice that extends in all directions. In terms of microstructure, it is composed mainly of 1,3-diol linkages [—$CH_2$—CH(OH)—$CH_2$—CH(OH)—] but a few percent of 1,2-diols [—$CH_2$—CH(OH)—CH(OH)—$CH_2$-] occur, depending on the conditions for the polymerization of the vinyl ester precursor.

The polyvinyl alcohol used in various embodiments of the present invention may have a hydrolysis value of over 75%, preferably over 95% or about 98%.

The properties of the polymer depend on the amount of residual ester groups. Commercial PVA grades are available with high degrees of hydrolysis (above 98.5%). The degree of hydrolysis, of the content of acetate groups in the polymer, has an overall effect on its chemical properties, solubility, and the crystallizability of PVA. The degree of hydrolysis and polymerization affect the solubility of PVA in water. PVA grades with high degrees of hydrolysis have low solubility in water. Residual hydrophobic acetate groups weaken the intra- and intermolecular hydrogen bonding of adjoining hydroxyl groups. The presence of acetate groups also affects the ability of PVA to crystallize. PVA grades containing high degrees of hydrolysis are more difficult to crystallize.

The polyvinyl alcohol used in various embodiments of the present invention may have an average molecular weight of 5-200 kDa, preferably 10-25 kDa, more preferably 15-20 kDa or about 17 kDa.

PVA is produced by free radical polymerization and subsequent hydrolysis, resulting in a fairly wide molecular weight distribution. A polydisperity index (PDI) is calculated as the weight average molecular weight divided by the number average molecular weight and indicates the distribution of individual molecular masses in a batch of polymers. A PDI of 2 to 2.5 is common for most commercial grades of PVA, but a PDI of 5 is not uncommon. Typical dispersities vary based on the mechanism of polymerization and can be affected by a variety of reaction conditions. In synthetic polymers, it can vary greatly due to reactant ratio, how close the polymerization went to completion, etc. The molecular weight distribution is an important characteristic of PVA because it affects many of its properties including crystallizability, adhesion, mechanical strength, and diffusivity. Generally a decreasing molecular weight distribution causes increased water solubility and increased flexibility.

The polyvinyl alcohol used in various embodiments of the present invention may have a degree of polymerization of 100-2200, preferably 100-350 or more preferably about 200-300.

The degree of polymerization (DP) is defined as the number of monomeric units in a macromolecule or polymer. General grades of PVA may include: ultra-low viscosity (DP<300 and average molecular weight <23 kDa), low viscosity (DP=350-650 and average molecular weight=31-50 kDa), medium viscosity (DP=1000-1500 and average molecular weight=85-124 kDa) and high viscosity (DP=1600-2200 and average molecular weight=146-186 kDa).

In another embodiment, the polymer matrix is envisioned to be comprised of additional insulating synthetic organic polymers and copolymers and blends thereof. The group includes, but is not limited to, low density polyethylene (LDPE), high density polyethylene (HDPE), polypropylene (PP), polystyrene (PS), polyvinylchloride (PVC), polytetrafluoroethylene (PTFE), polychlorotrifluoroethylene (PCTFE), polycarbonates, polysulfones, polystyrenes, polyamides, polyolefins, and polymethylacrylates.

In another embodiment, the polymer matrix is envisioned to be comprised of polyvinyl alcohol copolymers. The group includes, but is not limited to, copolymers of polyvinyl alcohol with vinyl chloride, vinyl acetate, vinyl butyral or polyvinyl alcohol-co-ethylene.

In another embodiment, the polymer matrix is envisioned to be comprised of the intrinsically conducting polymers and copolymers and blends thereof. The group includes, but is not limited to, polyfluorenes, polyphenylenes, polypyrenes, polyazulenes, polynapthalenes, polyacetylenes (PAC), poly (p-phenylene vinylene) (PPV), polypyrroles (PPY), polycarbazoles, polyindoles, polyazepines, polyanilines (PANI), polythiophenes (PT), poly (3,4-ethylenedioxythiophene (PEDOT) and poly(p-phenylene sulfide) (PPS).

The intrinsically conducting polymers are organic polymers that conduct electricity. They may have metallic conductivity or can be semiconductors.

In another embodiment, the polymer matrix is envisioned to be comprised of polyvinyl alcohol doped with additives including, but not limited to, crosslinkers, defoamers, biocides and plasticizers.

In a first aspect, the present invention relates to a nanocomposite shielding material comprising a polymer matrix, preferably polyvinyl alcohol, with metal nanoparticles, preferably silver nanoplatelets, dispersed in the matrix. The material is envisioned to act as a shield against electromagnetic interference, preferably from electromagnetic radiation in the microwave frequency range.

In a preferred embodiment the nanocomposite shielding material comprises nanoparticles dispersed throughout the polymer matrix. In a more preferred embodiment the nanocomposite shielding material comprises metal nanoparticles dispersed throughout the matrix. In a most preferred embodiment the nanocomposite shielding material comprises silver nanoparticles in the form of nanoplatelets dispersed throughout the matrix.

In a preferred embodiment, the metal nanoparticles are silver (Ag).

In another embodiment, the metal nanoparticles are envisioned to be selected from the group including, but not limited to, gold (Au), copper (Cu), nickel (Ni), palladium (Pd) and platinum (Pt) selected in terms of conductivity and economic reasons.

Nanoparticles are particles between 1 and 100 nm in size. A particle is defined as a small object that behaves as a whole unit with respect to its transport and properties.

Silver nanoparticles are nanoparticles of silver, i.e. silver particles of between 1 nm and 100 nm in size. While frequently described as being pure silver some are composed of a large percentage of silver oxide due to their large ratio of surface-to-bulk silver atoms.

In one embodiment, the silver nanoparticles have an average crystalline size of less than 15 nm, preferably in the range of 10-15 nm or about 13 nm.

In a preferred embodiment, the silver metal nanoparticles have the morphology of nanometer-thin nanoplatelets.

Nanoparticles are named for the real-world shapes that they appear to represent. The envisioned nanoparticles include, but are not limited to, nanospheres, nanoreefs, nanotubes, nanocylinders, nanorods, nanoboxes and nanostars. These morphologies sometimes arise spontaneously as an effect of the synthesis or from the innate crystallographic growth patterns of the materials themselves. Some of these morphologies may serve a purpose, such as bridging an electrical junction.

Nanoparticle characterization is necessary to establish understanding and control of nanoparticle synthesis and applications. Characterization is done by using a variety of different techniques, mainly drawn from materials science. Common techniques include, but are not limited to, electron microscopy (TEM, SEM), atomic force microscopy (AFM), dynamic light scattering (DLS), X-ray photoelectron spectroscopy (XPS), powder X-ray diffraction (XRD), Fourier transform infrared spectroscopy (FTIR), matrix-assisted laser desorption/ionization time-of-flight mass spectrometry (MALDI-TOF), ultraviolet-visible spectroscopy, Rutherford backscattering spectrometry (RBS), dual polarization interferometry and nuclear magnetic resonance (NMR).

In one embodiment, the silver metal nanoplatelets have a thickness of less than 10 nm, preferably in the range of 4-8 nm or about 6 nm.

In one embodiment, the silver metal nanoplatelets have an edge length or width of less than 10 μm, preferably in the range of 2-8 μm or about 5 μm.

In one embodiment, the silver metal nanoplatelets have a high aspect ratio of 100-500, preferably 200-400 or more preferably about 300.

The large amount of reinforcement surface area means that a relatively small amount of nanoscale reinforcement can have an observable effect on the macroscale properties of the composite. Nanoparticulates may result in improved electrical and thermal conductivity or enhanced optical properties, dielectric properties, heat resistance or mechanical properties such as stiffness, strength and resistance to wear and damage.

Generally, the nano reinforcement or filler is dispersed into the matrix during processing. The percentage by weight (mass fraction or mass ratio) of the nanoparticulates introduced can remain very low (on the order of 0.5% to 5% or 15%) due to the low filler percolation threshold, especially for non-spherical, high aspect ratio fillers such as nanometer-thin platelets, clays, cylinders or tubes.

As defined herein, percolation threshold is a mathematical concept related to the formation of long-range connectivity in random systems. Below the threshold a giant connected component does not exist; while above it, there exists a giant component of the order of the system size.

Silver nanoparticles and polyvinyl alcohol are combined at specific mass ratios. In one embodiment, the ratio of the polyvinyl alcohol to silver nanoparticles is 90:10. In another embodiment, the ratio may be 92:8, 94:6, 95:5, 96:4, 97:3, 98:2, 99:1 or 100:0.

In one embodiment, silver nanoparticles and polyvinyl alcohol are present in the composition at 0-15% and 100-85% by mass, respectively, based on the total weight of the composition.

The use of nanoparticles in polymer nanocomposites leads to changes in both physical and chemical properties. Two of the major factors in this are the increase in the ratio of the surface area to volume, and the size of the particle.

The increase in surface area to volume ratio, which increases as particles get smaller, leads to an increasing dominance of the behavior of atoms on the surface of the particle over that of those interior to the particle. This affects the properties of the particles when interacting with other particles within the mixture and can increase strength, heat resistance, etc. and many factors in the mixture.

Materials that use the properties of low-dimensional objects, such as nanoparticles in polymer nanocomposites, are promising for the ability to tailor a number of properties. Electrophysical, optical and magnetic properties are tunable by changing the size of nanoparticles, which can be controlled during the synthesis. In the case of polymer nanocomposites the properties of disordered systems are considered.

The addition of nanoparticles to the polymer matrix, even at low concentrations (~0.2 weight %), leads to significant improvements in the compressive and flexural mechanical properties of polymeric nanocomposites. Potentially, these nanocomposites may be used as novel, mechanically strong, light weight composites. The mechanical reinforcement is dependent on the nanostructure morphology, defects, dispersion of nanomaterials in the polymer matrix, and the cross-linking density of the polymer. In general, two-dimensional nanostructures can reinforce the polymer better than one-dimensional nanostructures, and inorganic nanomaterials are better reinforcing agents than carbon based nanomaterials.

EMI shielding on organic polymers mainly consists of conductive nanoparticles in a polymer matrix. They allow for the blending of the desired mechanical and electrical properties.

In one embodiment, the nanocomposite shielding material has a tensile strength of 20-50 MPa, more preferably 25-45 MPa depending on the mass ratio of the nanocomposite shielding material. The inclusion of silver metal nanoparticles may increase the tensile strength by at least 5 MPa (20%), preferably 15 MPa (60%) or 20 MPa (80%).

In one embodiment, the nanocomposite shielding material has a Young's modulus of 2-30 MPa, more preferably 5-25 MPa, depending on the mass ratio of the nanocomposite shielding material. The inclusion of silver metal nanoparticles may increase the tensile strength by at least 2 MPa (40%), preferably 5 MPa (100%) or 15 MPa (300%).

In one embodiment, the nanocomposite shielding material has a hardness shore A of 30-70, more preferably 35-65 depending on the mass ratio of the nanocomposite shielding material. The inclusion of silver metal nanoparticles may increase the hardness shore A by at least 5 (15%), preferably 15 (40%) or 30 (85%).

In one embodiment, the nanocomposite shielding material has an elongation at break of 90-5%, more preferably 10-60% depending on the mass ratio of the nanocomposite shielding material. The inclusion of silver metal nanoparticles may reduce the elongation at break.

Tensile strength is the maximum stress that a material can withstand while being stretched or pulled before failing or breaking. Young's modulus is a measure of a material's resistance to being deformed elastically (non-permanently) when a force is applied to it and the ratio of stress to strain. Hardness may be defined as a material's resistance to permanent indentation. Hardness shore refers to the use of the durometer scale, one of several measures of the hardness of a material, and the use of the A scale designates the scale for softer plastics. Elongation at break is the strain on a material when it breaks and is usually expressed as a percent between changed length and initial length after breakage.

Appropriately adding nanoparticulates to a polymer matrix can enhance its performance, often dramatically, by simply capitalizing on the nature and properties of the nanoscale filler. This strategy is particularly effective in yielding high performance composites, when good dispersion of the filler is achieved and the properties of the nanoscale filler are substantially different or better than those of the matrix. In addition to mechanical properties, fillers have also been used in polymer nanocomposites for the enhancement of the electrical conductivity.

In one embodiment, the nanocomposite shielding material has an electrical conductivity of $10^{-15}$-10 $ohm^{-1}cm^{-1}$, more preferably $10^{-7}$-10 $ohm^{-1}cm^{-1}$ depending on the mass ratio of the nanocomposite shielding material. The inclusion of silver metal nanoparticles may increase the conductivity at least 8 orders of magnitude, transitioning the material from an insulator to a semiconductor or conductor.

In one embodiment, the nanocomposite shielding material has a dielectric constant of 1-85, more preferably 20-80 depending on the mass ratio of the nanocomposite shielding material and the frequency of incident electromagnetic radiation. The inclusion of silver metal nanoparticles increases the dielectric constant by 5-25 at high frequencies and 25-80 at lower frequencies.

In one embodiment, the nanocomposite shielding material has a an electrical conductivity percolation threshold of less than 3.0 weight percent silver metal nanoparticles relative to the total weight of the nanocomposite shielding material, preferably in the range of 1.0-2.0 weight percent or about 1.5 weight percent.

In a preferred embodiment, the silver nanoplatelets of the nanocomposite shielding material are dispersed effectively to form seamlessly interconnected infinite conductive networks.

Conductivity refers to a material's ability to conduct an electric current, calculated as the ratio of the current density in the material to the electric field that causes the flow of current arising from free conduction electrons. Dielectric constant or relative permittivity is a material property expressing the force between two point charges in the material. It is expressed as a ratio relative to the permittivity of vacuum and a factor by which the electric field between the charges is decreased relative to vacuum. Chemically, it can generally be thought of as a relative measure of the chemical polarity of a material.

In a mixture between a dielectric or insulating material and a metallic component, the conductivity ($\sigma$) and the dielectric constant ($\in$) of the mixture show a critical behavior if the fraction of the metallic component reaches the percolation threshold. The behavior of the conductivity near this percolation threshold will show a smooth change over from the conductivity or insulation of the dielectric component to the conductivity of the metallic component. Below the percolation threshold in conductor-insulator mixtures we have no conductivity because of the relative insulator and just finite metallic clusters.

When an electromagnetic wave passes through a shielding material, absorption and reflection both occur. Residual energy emerges from the shielding material, it is the part of the remaining that is neither absorbed nor reflected by the shielding material. EMI SE is expressed in decibel (dB). A SE of 20-30 dB, corresponding to 99.9% attenuation of the EMI radiation, is considered an adequate level of shielding for many applications.

In a preferred embodiment, the nanocomposite shielding material demonstrates shielding effectiveness against electromagnetic radiation having microwave frequencies of less than 300 GHz, more preferably those below 20 GHz and most preferably those in the range 0.1-12 GHz.

In one embodiment, the nanocomposite shielding material has an electromagnetic reflection loss of 1-20 dB, more preferably 3-12 dB depending on the mass ratio of the nanocomposite shielding material and the frequency of incident electromagnetic radiation. The inclusion of silver metal nanoparticles increases the reflection loss by 2-7 dB at high frequencies and 3-11 dB at lower frequencies.

In one embodiment, the nanocomposite shielding material has an electromagnetic absorption loss of 5-65 dB, more preferably 15-60 dB depending on the mass ratio of the nanocomposite shielding material and the frequency of incident electromagnetic radiation. The inclusion of silver metal nanoparticles increases the absorption loss by 5-55 dB at high frequencies and 15-60 dB at lower frequencies.

In one embodiment, the nanocomposite shielding material has a total electromagnetic shielding effectiveness of 6-85 dB, more preferably 18-72 dB depending on the mass ratio of the nanocomposite shielding material and the frequency of incident electromagnetic radiation. The inclusion of silver metal nanoparticles increase the reflection loss by 7-62 dB at high frequencies and 18-71 dB at low frequencies.

Shielding is the process by which a certain level of attenuation is extended using a strategically designed EM shield. The shielding efficiency is generally measured in terms of reduction in magnitude of incident power/field upon transition across a shield. For efficient shielding action, the material or coating should possess either mobile charge carriers (electrons or holes) or electric and/or magnetic dipoles which interact with the electric (E) and magnetic (H) vectors of the incident EM radiation.

Three different mechanisms namely reflection (R), absorption (A) and multiple internal reflection (MIRS) contribute towards overall attenuation with $SE_R$, $SE_A$ and $SE_M$ as corresponding shielding effectiveness components due to reflection, absorption and multiple reflections respectively. Absorption depends on the bulk, or thickness, of the shielding material. Reflection occurs at the surface of shielding materials, and is independent of thickness. Generally, maximum reflection occurs for materials with the highest conductivity.

The reflection loss ($SE_R$) is related to the relative impedance mismatch between the shield's surface and the propagating wave. The magnitude of reflection loss under plane wave can be expressed as a function of the ratio of conductivity ($\sigma$) and permeability ($\mu$) of the shield material ($\sigma/\mu$). Further, for a given material $SE_R$ decreases with increase in frequency.

When an electromagnetic wave passes through a medium its amplitude decreases exponentially. This decay or absorption loss occurs because currents induced in the medium produce ohmic losses and heating of the materia. The thicker the material the greater the absorption loss. The magnitude of absorption is proportional to the square root of the product of the permeability ($\mu$) times the conductivity ($\sigma$) or $(\sigma\mu)^{1/2}$. Further, for a given material absorption loss may theoretically increase with increases in frequency. Thus, a good absorbing material should possess high conductivity and high permability, and sufficient thickness to achieve the required number of skin depths even at the lowest frequency of concern.

If a shield is thin, the reflected wave from the second boundary is re-reflected from the first boundary and returns to the second boundary to be reflected again and again. The attenuation due to these multiple internal reflection, $SE_M$, is closely related to absorption loss, $SE_A$. It is important for porous structures and some filled composites but can be neglected in the case of a thick absorbing shield due to a high enough $SE_A$ value that by the time the wave reaches the second boundary, it is of negligible amplitude. For highly absorbing materials or at high frequencies (~GHz or higher), and with the condition $SE_A \geq 10$ dB $SE_M$ can be safely neglected and re-reflections can be safely ignore as $SE_M=0$.

In order to meet design requirements and for extending efficient shielding action, shielding material should possess a balanced combination of electrical conductivity ($\sigma$), dielectric permittivity ($\in$) and magnetic permeability ($\mu$) and physical geometry. The primary mechanism of EMI shielding is reflection from the front face of the shield, for which the shield must possess mobile charge carriers (electrons or holes) that can interact with the electromagnetic fields to cause ohmic (heating) losses in the shield. As a result the shield must be electrically conducting, although only moderate conductivity ($10^{-3}$ to 1.0 S/cm) is sufficient. The secondary EMI shielding mechanism is absorption for which the shielding material must possess electric and/or magnetic dipoles which can interact with the electromagnetic fields in the radiation.

In a second aspect, the present invention relates to a method for the production of the nanocomposite shielding material described herein.

In a preferred embodiment, the simple, efficient and environmentally benign wet chemistry methodology for the fabrication of metal nanoparticle-embedded polymer films comprises the in situ reduction of metal ions inside a solid polymer matrix. The presence of an additional colloidal stabilizer against nanoparticle aggregation is not necessary.

The nature of the precursor metal salt, polymer, metal/polymer ratio and fabrication conditions including, but not limited to, temperatures, sonications and step durations are the experimental parameters that can be varied to achieve control of the size, shape and density of nanoparticles inside the polymer matrix. In addition, the mechanical and electrical properties of the nanocomposite material itself can be controlled.

In one embodiment, the thickness of the final nanocomposite shielding material is controlled in a final casting step. The film is envisioned to be 100 nm to 0.5 mm thick, preferably less than 0.5 mm or about 0.2 mm.

There are many different synthetic routes to silver nanoparticles. They can be broadly divided into three categories: physical vapor deposition, ion implantation, or wet chemistry.

Physical vapor deposition has been used to create silver nanoparticles. The process describes a variety of vacuum deposition methods used to deposit thin films by the condensation of a vaporized form of the desired film material onto various workpiece surfaces. The coating method involves purely physical processes such as high-temperature vacuum evaporation with subsequent condensation, or plasma sputter bombardment rather than involving a chemical reaction at the surface to be coated. These technologies operate at very high temperatures and vacuums, requiring special consideration. Additionally, line-of-sight transfer can be characteristic making full coverage of complex geometries hard to achieve.

In another embodiment, ion implantation is envisioned to generate the nanocomposite shielding material.

Ion implantation has been used to create silver nanoparticles. The process can produce silver particles embedded in glass, polyurethane, silicone, polyethylene and polymethacrylate. The particles grow in the substrate with the bombardment of ions. This process can be energetically costly and although the existence of the nanoparticles can be proven the exact nature of the particles created with this method is unknown.

There are also several wet chemical methods for creating silver nanoparticles. Typically they involve the reduction of a silver salt with a reducing agent in the presence of a colloidal stabilizer if necessary.

In a preferred embodiment the metal nanoparticles are silver (Ag). To prepare the colloid solution of metal nanoparticles according to the present invention, any metal salt capable of forming a general nanoparticle colloid solution can be used without limitations. However, in terms of conductivity and economical reasons, a salt of at least one metal selected from the group consisting of silver (Ag), gold (Au), copper (Cu), nickel (Ni), palladium (Pd), and platinum (Pt) is preferred, with the silver salt being more preferable.

In a preferred embodiment, the silver salt precursor is $AgNO_3$.

The metal salt is, for example but not limited to, halide, nitrate, sulfate, hydrochloride, perchlorate, or acetate. According to the present invention, a silver salt such as $AgNO_3$, $AgClO_4$, $Ag_2SO_4$, or $CH_3COOAg$ is more preferred. These silver salts are well dissolved in water and thus form an aqueous colloid of silver nanoparticles.

In a preferred embodiment, the reducing agent is $\beta$-$_D$-Glucose.

A reducing sugar is any sugar that either has an aldehyde group or is capable of forming one in solution through isomerism. The aldehyde functional group allows the sugar to act as a reducing agent. The cyclic hemiacetal forms of aldoses can open to reveal an aldehyde and certain ketoses can undergo tautomerization to become aldoses.

Reducing monosaccharides include, but are not limited to, glucose, glyceraldehyde and galactose. Many disaccharides, like lactose and maltose, also have a reducing form, as one of the two units may have an open chain form with an aldehyde group. However, sucrose and trehalose, in which the anomeric carbons of the two units are linked together, are non-reducing disaccharides since neither of the rings is capable of opening.

In another embodiment, the reducing agent is envisioned to be selected from the group including, but is not limited to, Glucose, sodium borohydride ($NaBH_4$), sodium citrate, ascorbic acid, fructose, lactose, sucrose, glyceraldehyde, galactose, maltose, dextrose or other reducing sugars.

In another embodiment, the use of a colloid stabilizer is envisioned to be selected from the group including, but not limited to, citrate, cellulose, starch, bovine serum albumin, gelatin, or polyvinyl pyrrolidone.

In another embodiment, the process can be envisioned to produce silver nanoparticles independent of the use of a reducing agent. The polymer itself can serve as the reducing agent, the stabilizer, or both.

In a third aspect, the present invention relates to an electronic device comprising the nanocomposite shielding material described herein. The nanocomposite shielding material may be present in or on the electronic device.

In one embodiment, the electronic device is envisioned to be a cable. The shielded cable possesses electromagnetic shielding in the form of a material surrounding an inner core conductor. The shielding impedes the escape of any signal from the core conductor, and also prevents signals from being added to the core conductor. It is also envisioned that the cable may have two separate coaxial screens, one connected at both ends, the other at one end only, to maximize shielding of both electromagnetic and electrostatic fields.

In one embodiment of the current invention EMI shielding is envisioned to be accomplished by applying a conductive coating of the nanocomposite shielding material to at least one side of a plastic part. Many electronic products today are made of plastic, which has no intrinsic shielding capability.

Additional, non-limiting, applications of the nanocomposite shielding material include a screen built into the door of a microwave oven, preventative access to secure data stored on RFID chips embedded in various devices (biometric passports), protection of medical and laboratory equipment against interfering signals, including AM, FM, TV, emergency services, dispatch, pagers, cellular, ESMR and PCS or electromagnetic shielding protection for computers and keyboards to prevent passive monitoring of keyboard emissions that would allow passwords and data to be captured. Consumer keyboards do not offer this protection primarily because of the prohibitive cost.

The examples below are intended to further illustrate protocols for preparing and assessing the PVA/Ag nanocomposite shielding materials for microwave electromagnetic interference shielding efficiency described herein, and are not intended to limit the scope of the claims.

EXAMPLE 1

Chemicals

The polymer polyvinyl alcohol (PVA) used in various embodiments of the present invention was supplied in powder with an average molecular weight of 17 kDa, density of 1.21 $g/cm^3$ and a hydrolyzed value of 98%. PVA was purchased from Aldrich Company and used directly without further purification. Millipore MilliQ purified deionized water was used in all operations. The silver nitrate ($AgNO_3$) (99.998%) used as source for silver nanoparticles and β-$_D$-Glucose used as a reducing agent were also purchased from Aldrich Company and utilized directly without further purification in the embodiments described herein.

EXAMPLE 2

Preparation of Ag Nanoparticles and PVA/Ag Nanocomposite Films

The nanocomposite films with different weight fractions of Ag nanoparticle filler were prepared by a solvent casting technique. Several batches of PVA/Ag weight ratios are: 100/0, 99/1, 98/2, 97/3, 96/4, 95/5, 94/6, 92/8 and 90/10 and abbreviated as PAg0, PAg1, PAg2, PAg3, PAg4, PAg5, PAg6, PAg8 and PAg10 respectively.

The PVA was dissolved in deionized water at 100° C. and stirred for 4 hrs with nitrogen gas bubbling into the PVA solution to remove oxygen. The PVA solution was left to outgas overnight and showed a viscosity of 0.591 dL/g and a pH of about 6.7. The $AgNO_3$ was dissolved in distilled water and stirred for 4 hrs at room temperature. Various contents of $AgNO_3$ (ranging from 0 wt % to 10 wt %) were added to the initial PVA solution and the reaction mixture was stirred for 5 hrs at room temperature and 1 hr at 60° C. The β-D-glucose, as reducing agent, was added to the reaction mixture and stirred for 1 hr at 60° C. followed by ultrasonic irradiation (1000 W) for 6 hrs. After cooling the reaction mixture to room temperature, it was centrifuged several times with distilled water to obtain silver. Finally, the reaction mixture solution was cast into polystyrene Petri dishes and left to dry at room temperature for 4 days. The average thickness of the flexible thick films was about 0.2 mm.

EXAMPLE 3

Characterizations of the Prepared Ag Nanoparticles and PVA/Ag Nanocomposites

The results obtained from a variety of relevant instrumental studies of the as synthesized pure Ag nanoparticles and PVA/Ag nanocomposites, to offer insights into the morphology, mechanical and electrical properties, are laid out in the following examples.

EXAMPLE 4

X-Ray Diffraction (XRD) Analysis of the Prepared Ag Nanoparticles

X-ray diffraction (XRD) was carried out by the X-ray powder diffraction method at ambient temperature for determining the phase identity and crystalline size of the as prepared Ag nanoparticles. A Rigaku (model RU-300, Japan) X-ray diffractometer with Cukα of 0.1540 nm radiation was used. The patterns were recorded in the range of 2θ=5°-80°. FIG. 1 displays the XRD pattern of as synthesized Ag nanoparticles. The pattern contains peaks of (100), (200), (220), and (311) planes at 38.20°, 44.40°, 64.60°, and 77.60° respectively. This corresponds to the typical Ag with face-centered cubic structure having a lattice constant a=0.410 nm comparable to that of the Joint Committee on Powder Diffraction Standards (JCPDS) card no. No X-ray peaks arising from impurities can be detected indicating the $AgNO_3$ has been completely reduced to Ag.

Relatively broad X-ray peaks reveal the small size of Ag crystals. The average domain crystallite sizes (D) for the as prepared Ag nanoparticles were determined by Scherrer's formula: D=(kλ)/(βcos θ) where k is the constant, λ is the wavelength of the X-ray source, β is the full width at half maximum and θ is the diffraction angle in radian. The evaluated value of average crystalline size according to the Scherrer diffraction formula is approximately 13 nm. The silver nanoparticles comprising the nanocomposite shielding material preferably have an average crystalline size of 10-15 nm.

EXAMPLE 5

Field Emission Scanning Electron Microscopy (FESEM) and Transmission Electron Microscopy (TEM) Analysis of the Prepared Ag Nanoparticles and PVA/Ag Nanocomposites The surface morphology of the as synthesized pure Ag nanoparticles and PVA/Ag composites was observed and studied at high and low magnification by a field emission scanning electron microscope (FESEM). The JEOL JSM-6060LV was used with electron energy of 15 keV and the specimens coated with carbon using a vacuum evaporator (JEOL, GEE 500).

Figure 2A:
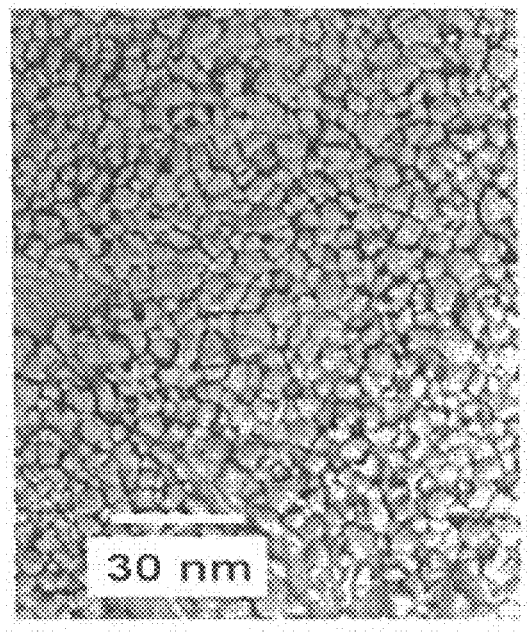
FIG. 2A is a field emission scanning electron microscope (FESEM) micrograph of as synthesized silver nanoparticles (1000× magnification).
Figure 2B:
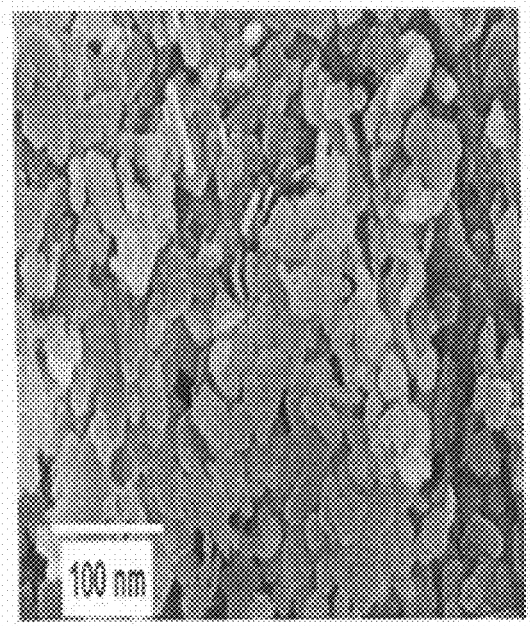
FIG. 2B is a FESEM micrograph of as synthesized silver nanoparticles (10000× magnification).

FIG. 2A shows the typical low magnification (1000× magnification) micrograph of the as synthesized Ag nanoparticles. The micrograph demonstrates that the prepared Ag nanoparticles possess uniform platelet-shaped morphology and that the Ag nanoplatelets are formed in high yield. FIG. 2B shows the typical high magnification (10000× magnification) micrograph of the as synthesized Ag nanoparticles. The micrograph shows that the typical thickness and edge length (width) of the as prepared Ag nanoplatelets are about 14 nm and 5 μm, respectively.

Figure 3:
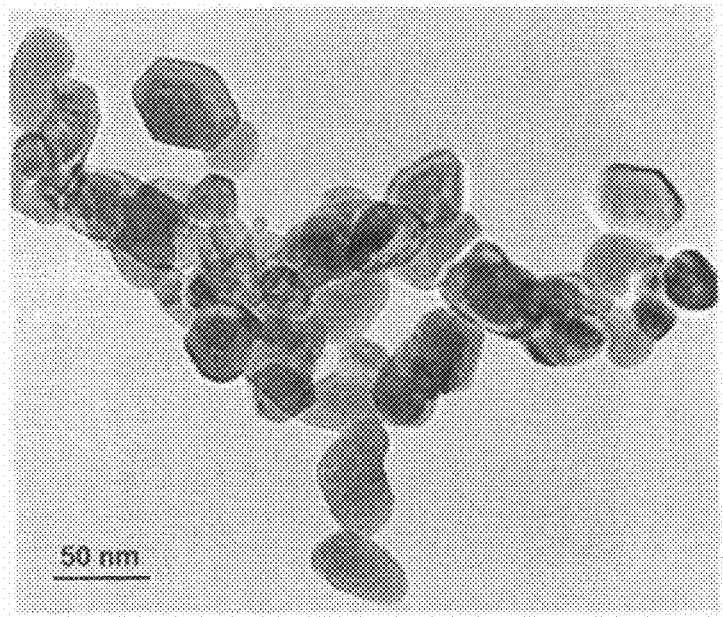
FIG. 3 is a transmission electron microscope (TEM) micrograph of as synthesized silver nanoparticles.

Detailed morphology of the as synthesized Ag nanoplatelets was examined by a transmission electron microscope (TEM). Images were taken with a Hitachi H-800 at an acceleration voltage of 200 kV. FIG. 3 shows the typical low resolution TEM micrograph of the as synthesized Ag nanoplatelets. It is apparent that the nanoplatelets are made by the thin Ag nanosheets. The typical thickness of the nanosheets is in the range of 14 nm. It is also apparent that the nanosheets are synthesized in large quantity. All the TEM observations regarding shape, size and thickness are well matched with the obtained FESEM results.

Figure 4A:
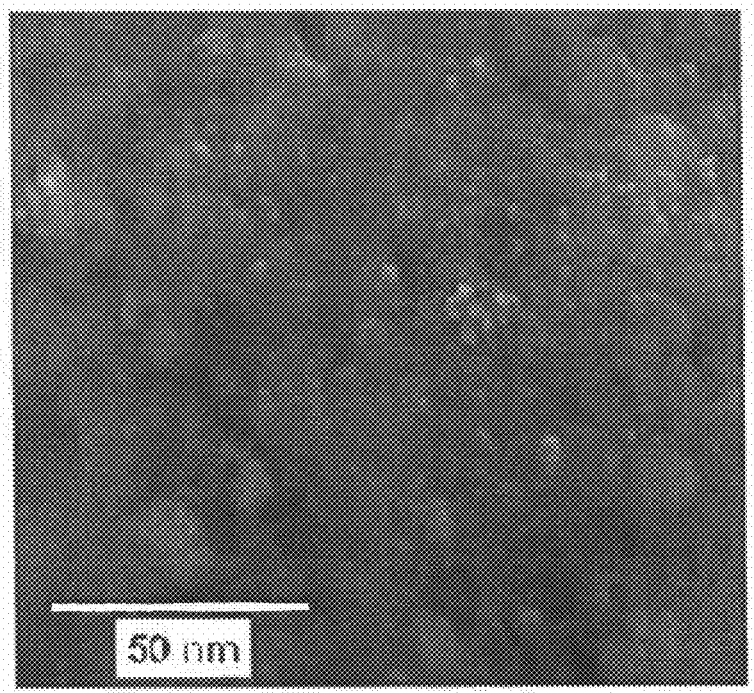
FIG. 4A is a FESEM micrograph of PVA/Ag nanocomposite containing 1 wt % Ag in PVA.
Figure 4B:
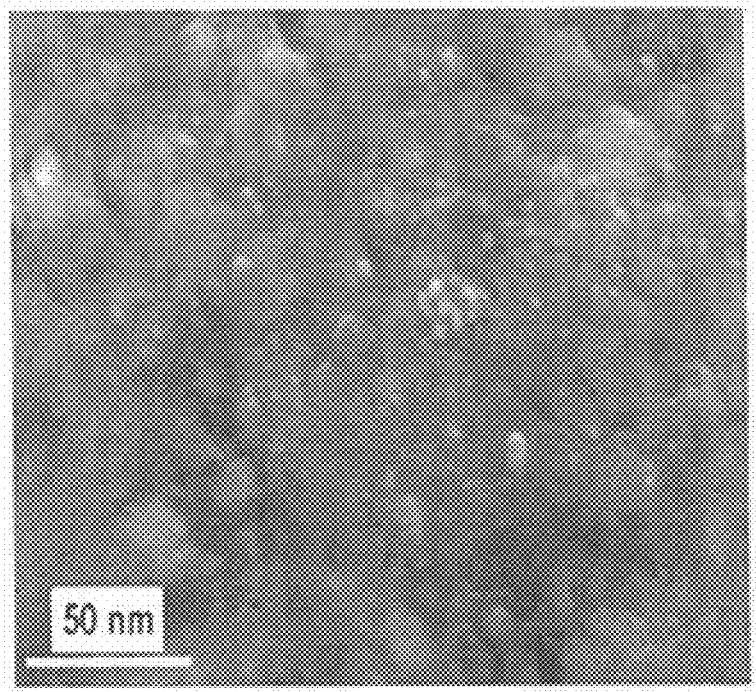
FIG. 4B is a FESEM micrograph of PVA/Ag nanocomposite containing 2 wt % Ag in PVA.
Figure 4C:
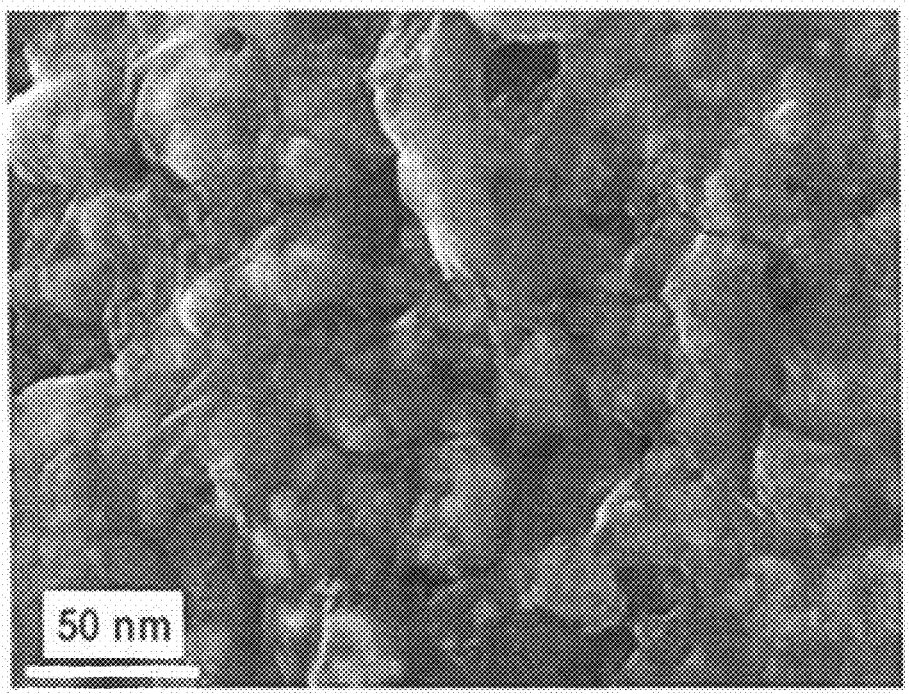
FIG. 4C is a FESEM micrograph of PVA/Ag nanocomposite containing 4 wt % Ag in PVA.
Figure 4D:
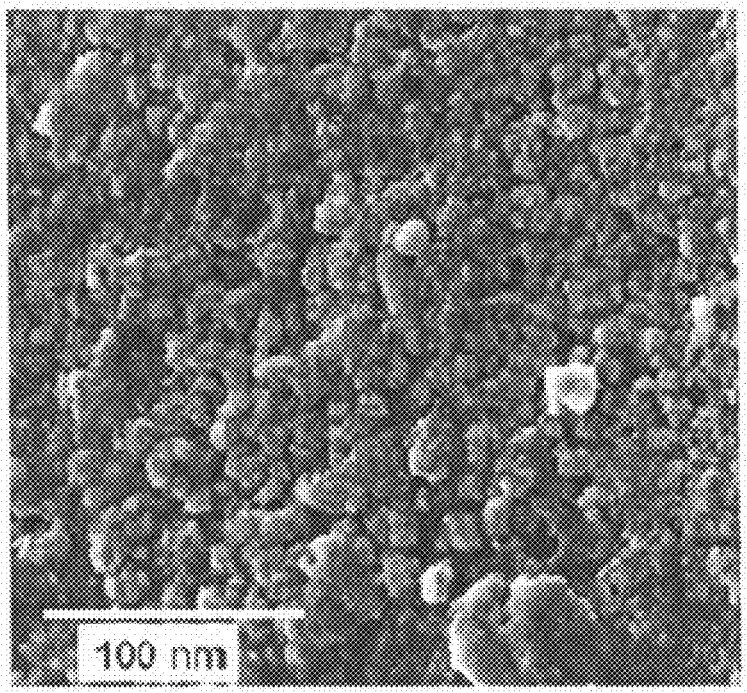
FIG. 4D is a FESEM micrograph of PVA/Ag nanocomposite containing 5 wt % Ag in PVA.
Figure 4E:
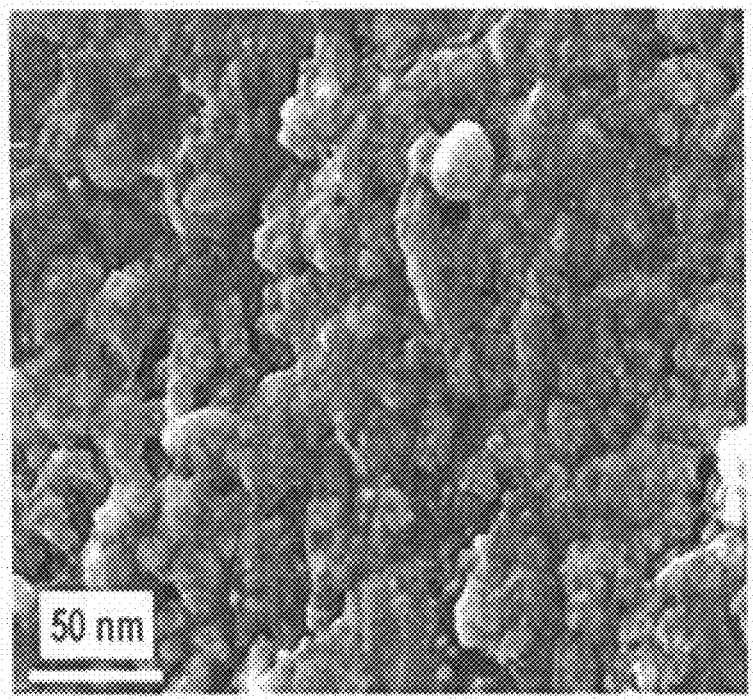
FIG. 4E is a FESEM micrograph of PVA/Ag nanocomposite containing 6 wt % Ag in PVA.
Figure 4F:
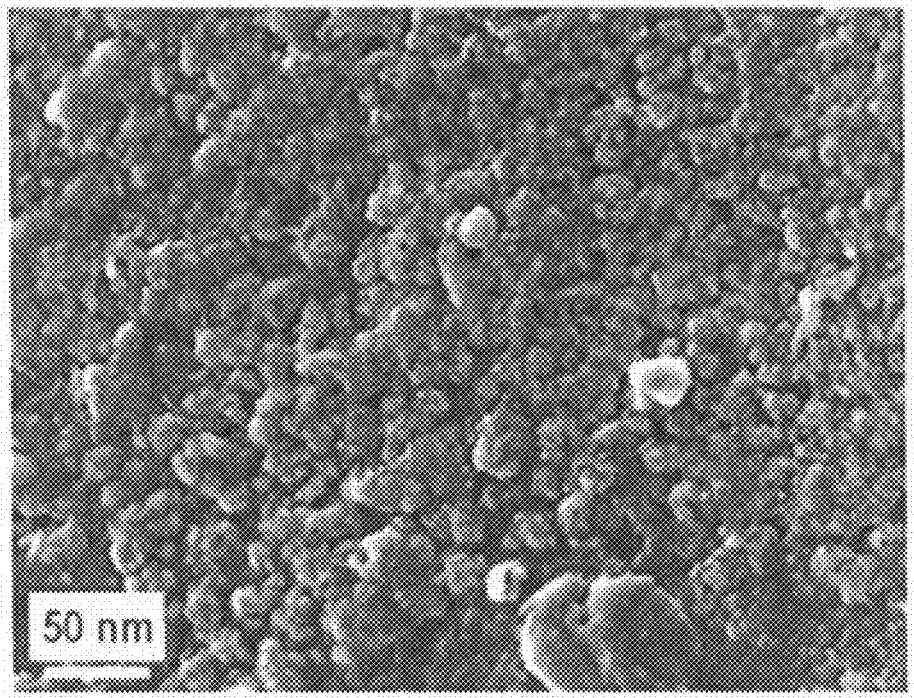
FIG. 4F is a FESEM micrograph of PVA/Ag nanocomposite containing 10 wt % Ag in PVA.

The dispersion of Ag nanoparticles in the PVA matrix and the interfacial adhesion between them can additionally be evaluated by FESEM. FIG. 4A-F shows FESEM micrographs of PVA/Ag nanocomposites containing 1, 2, 4, 5, 6 and 10 wt %. The Ag nanoparticle loadings are displayed in FIG. 4A-F respectively. FIG. 4A-B, the micrographs of material PAg1 and PAg2 demonstrate the presence of some gallery space in the PVA matrix of the nanocomposite. The density of the PVA insulating matrix is higher. For comparison, the micrograph of FIG. 4F of the sample PAg10 indicates that Ag nanoparticles are well and evenly dispersed in the entire PVA matrix and there is good interaction adhesion between Ag nanoparticles and the PVA matrix.

Figure 5:
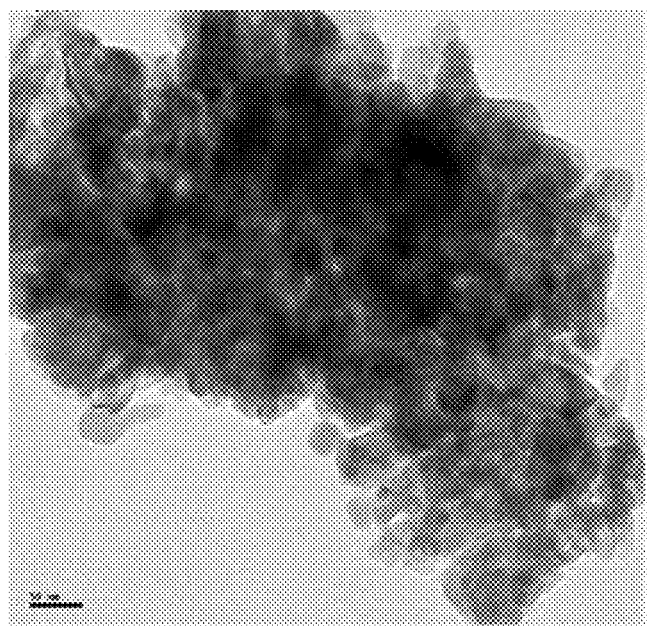
FIG. 5 is a TEM micrograph of PVA/Ag nanocomposite containing 10 wt % Ag in PVA.

To further confirm the above facts the TEM of PVA containing 10 wt % Ag nanoparticles was obtained. FIG. 5 shows this micrograph. It is clear that the Ag nanoparticles are well dispersed and interlinked with PVA chains at this loading level of Ag.

EXAMPLE 6

Mechanical Properties Analysis of the Prepared PVA/Ag Nanocomposites

Figure 6:
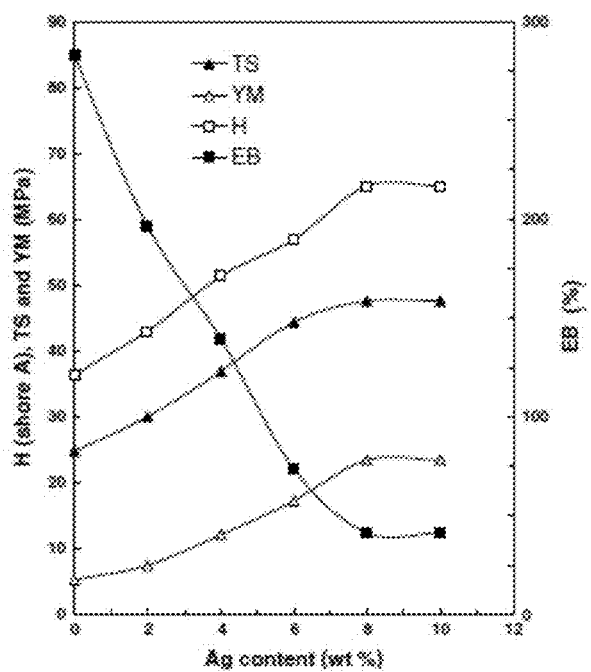
FIG. 6 illustrates the effect of wt % Ag content in PVA/Ag nanocomposites on tensile strength (TS), Young's modulus (YM), hardness shore A (HA) and elongation at break (EB).

To further confirm the above facts, the mechanical properties including tensile strength (TS), Young's modulus (YM), hardness shore A (H) and elongation at break (EB) were measured. FIG. 6 presents these values as a function of the Ag nanoparticle content. Tensile strength of samples was determined using a testing instrument Instron, UK, with a 2 kN load cell and a crosshead speed of 12 mm/min at room temperature. Young's modulus, tensile strength, and elongation at break can be calculated from obtained load versus elongation patterns. The obtained results were averaged over three samples. Hardness shore A can be determined using a universal testing machine (ASTM-D2240-78).

Generally, the TS, YM and H increase with increasing Ag content in the PVA/Ag nanocomposites. The increasing loading of the Ag nanoparticles results in strong polymer filler interaction as a result of the crosslinking effect and formation of uniform Ag homogenities. Additionally, the presence of Ag nanoparticles can attenuate the crack propagation. Enhanced shear transfer stress of the nanocomposites is attributed to fewer Ag absences in the matrix.

Generally, the elongation at break decreases with increasing loading levels of Ag. As more and more Ag nanoparticles incorporate into the PVA matrix, the mobility of the macromolecular chains of the PVA is lessened. This results in more rigid composites. Furthermore, void formation decreases and the entanglement network is increased. Thus, the greater the Ag inclusion the more significant the increase in stiffness and the reduction in micro-defect.

EXAMPLE 7

Electrical Conductivity Analysis of the Prepared PVA/Ag Nanocomposites

The DC electrical conductivity was measured for nanocomposite samples by a two point method using a Keithley 237 high-voltage source measurement unit and a Keithley 2010 multimeter equipped with a 2000-SCAN10 channel scanner card. The electrical contacts made by carbon ink are Ohmic in nature at room temperature. The data can be automatically collected using a suitable interface and data acquisition method. Conductivity was calculated from current-voltage characteristics using the following equation: $\sigma=(It/VA)$ $(\Omega cm)^{-1}$, where I is the current, t is the thickness of the sample, A is the area of the sample and V is the voltage applied. Carrier concentration and mobility carriers were estimated by Hall effect measurements with AC magnetic field modulation using the van der Pauw configuration.

Figure 7:
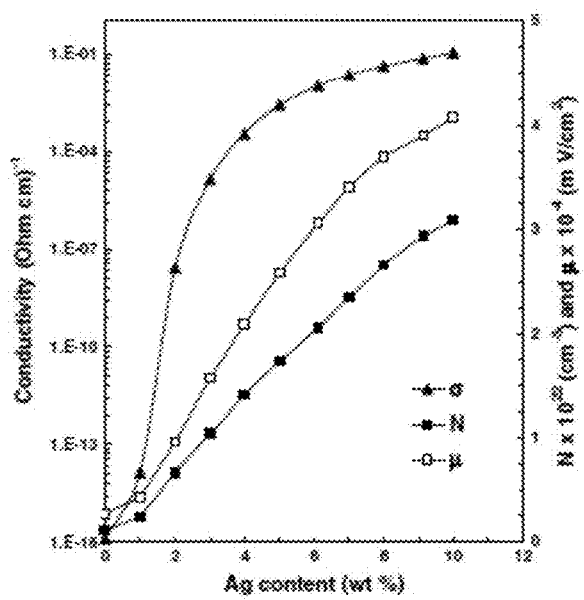
FIG. 7 illustrates the effect of wt % Ag content in PVA/Ag nanocomposites on electrical conductivities (σ), mobility carriers (μ) and number of charge carriers (N) at ambient temperature.

The room temperature electrical conductivities ($\sigma$), mobility carriers ($\mu_c$) and number of charge carriers (N) of prepared PVA/Ag nanocomposites as a function of Ag nanoparticle weight content is shown in FIG. 7. PVA, like most polymers, is an electrical insulator with a DC conductivity value on the order of $10^{-15}$ S cm$^{-1}$ at room temperature. Increasing the content of Ag nanoparticles in the nanocomposite increases the conductivity. Even at low Ag content the electrical conductivity of the nanocomposite increases. This is attributed to even at low Ag weight fraction there is a good dispersion of Ag nanoparticles throughout the entire PVA matrix and a good interface adhesion among filler and matrix allowing conductivity, even low, for the nanocomposites.

The conductivity increases greatly with increasing Ag nanoparticle content. This is attributed to the dispersion of Ag nanoparticles and the increase of adhesion force between Ag nanoparticles and the PVA polymer matrix. Furthermore, the Ag nanoparticles form seamlessly interconnected structures leading to infinite conductive networks throughout the entire nanocomposites and providing a rapid electron transport path inside of it.

The PVA/Ag nanocomposites show a sharp transition from an electrical insulator to an electrical semiconductor at a low Ag content of about 1 wt %. The abrupt conductivity transition comes about at a critical Ag content, regarded as the percolation threshold. This low percolation threshold is attributed to the high aspect ratio and geometric morphology of the Ag nanoplatelets particles which provides advantages in forming particle-particle contacts across the entire PVA matrix.

EXAMPLE 8

Dielectric Properties Analysis of the Prepared PVA/Ag Nanocomposites

Figure 8:
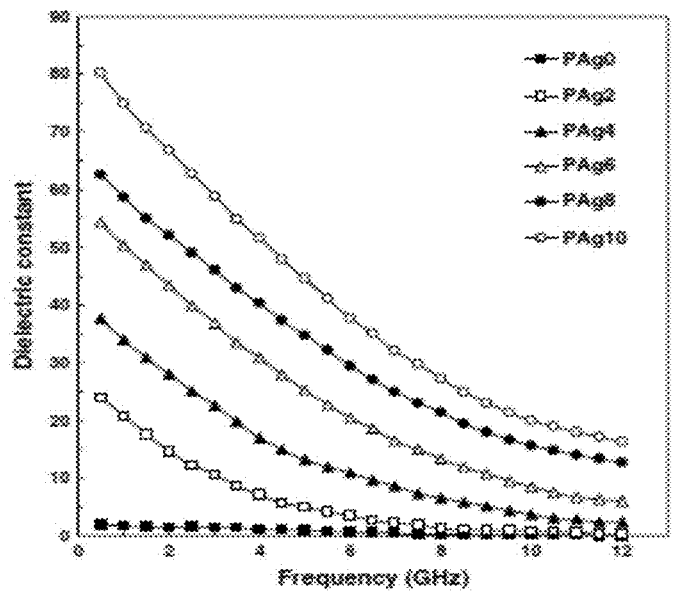
FIG. 8 illustrates the effect of frequency and wt % Ag content in PVA/Ag nanocomposites on dielectric constant at ambient temperature.

The dielectric constant, dielectric loss and imaginary permittivity of PVA/Ag nanocomposites were automatically recorded for different frequencies by sandwiching test samples between two carbon electrodes of 2 cm in diameter. The variation of dielectric constant with different Ag nanoparticles as well as frequency is demonstrated in FIG. 8. It is shown that dielectric constant increases with increasing Ag content of PVA/Ag nanocomposites.

The observed variation in dielectric properties is understood by the Maxwel-Wagner_Sillars (MWS) effect of polarization attributing the enhancement in dielectric properties to interfacial polarization. This phenomenon appears in heterogeneous media consisting of phases with different dielectric permittivity and conductivity and is mainly due to the accumulation of charges at the interfaces. Here, PVA is a polar polymer where each dipole can act as an electron trap. The Ag nanoparticles present in the PVA matrix act as charge reservoirs and these reservoirs increase with Ag content, enhancing the average polarization. Thus, the mobile ions and electrons may be responsible for the enhancement of the dielectric constant. The increase in dielectric constant reflects the space charge relaxation, the process connected with the decrease in the amount of free amorphous polymer matrix part.

Additionally, the high value of dielectric constant at low frequency decreases with an increase in frequency at all Ag contents. This can be explained on the basis of charge carriers being blocked at the electrodes. Generally, dipoles in a macromolecule tend to orient themselves in the direction of the applied field in the low frequency range. As the frequency of the applied field increases the dipoles are unable to orient themselves in the direction of the applied field, leading to the decrease in dielectric constant at high frequency.

Figure 9:
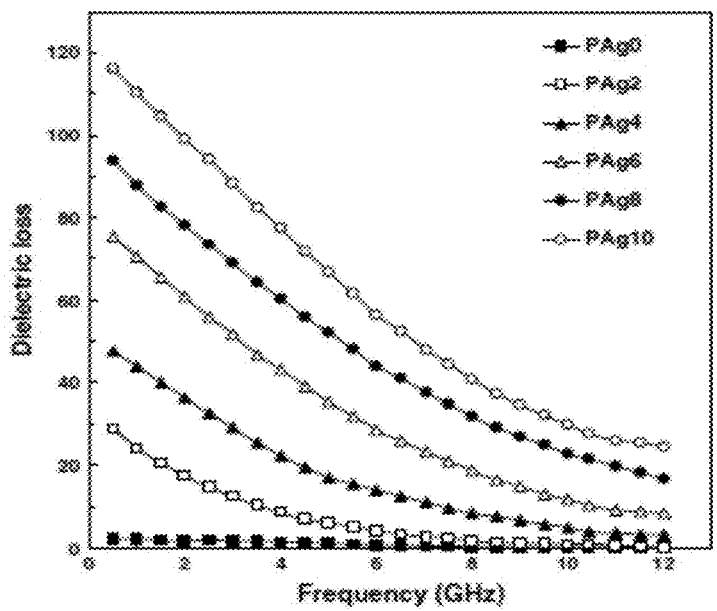
FIG. 9 illustrates the effect of frequency and wt % Ag content in PVA/Ag nanocomposites on dielectric loss at ambient temperature.

The variation of dielectric loss versus frequencies of PVA/Ag nanocomposites is illustrated in FIG. 9. The dielectric loss of all the PVA/Ag nanocomposites is significantly higher than that of pure PVA attributed to increasing interfacial polazation dependent on Ag content in the nanocomposites.

The dielectric loss (the quantification of a dielectric material's inherent dissipation of electromagnetic energy) is high at low frequencies due to the free charge motion within the composite. The dielectric loss decreases with increasing frequency for the PVA/Ag nanocomposites. This is likely a result of structural rearrangement of the molecules within the PVA polymeric matrix. Dielectric loss is a direct function of the relaxation process and the origin of this relaxation is due to local motion of the polar groups. As the frequency increases the dipole polarization effect drops to zero and the dielectric loss factor depends on the electronic polarization.

EXAMPLE 9

Shielding Effectiveness (SE) Analysis of the Prepared PVA/Ag Nanocomposites

The EMI shielding effectiveness (SE) of PVA/Ag nanocomposites was measured with a Hewlett-Packard waveguide line containing spectro analyzer. Measurements of reflection and attenuation were obtained using the measurement of output (adopted) power ($P_a$) in the output of a measuring line without losses, where samples of materials may be included. A coaxial line was used because of the wide frequency measurement. Samples of shielding materials were shaped like discs with an external diameter D=20.6 mm, equal to the outer diameter of the coaxial line and thickness=2 mm. The internal diameter is dependent on the relative dielectric permittivity of the material. Part of the incident electromagnetic wave with power ($P_{in}$) on the sample was reflected from it. The rest of the wave with power ($P_p$) penetrates the material so that the attenuation (A) depends on the coefficient of reflection (R). So attenuation is determined by: A=10 log ($P_a/P_p$) dB where $P_p=P_{in}(1-|R|^2)$.

EMI shielding effectiveness (SE) is a measure of the reduction of EMI at a particular frequency achieved by a shield material. The SE in units of dB of a sample is defined for a transverse electromagnetic wave propagating into a sample with negligible magnetic interaction as SE=10 log ($P_{in}/P_{out}$)=R+A+M. $P_{in}$ and $P_{out}$ are the power incident on and transmitted through a shielding material. R is the sum of the initial reflection losses from both surfaces of the shield and exclusive of additional reflection losses; it is a function of the ratio $\sigma_r/\mu_r$. A is the absorption or penetration loss within the barrier itself; it is a function of the product $\sigma_r\mu_r$. M is a positive or negative correction term induced by the reflecting waves inside the shielding barrier.

Figure 10:
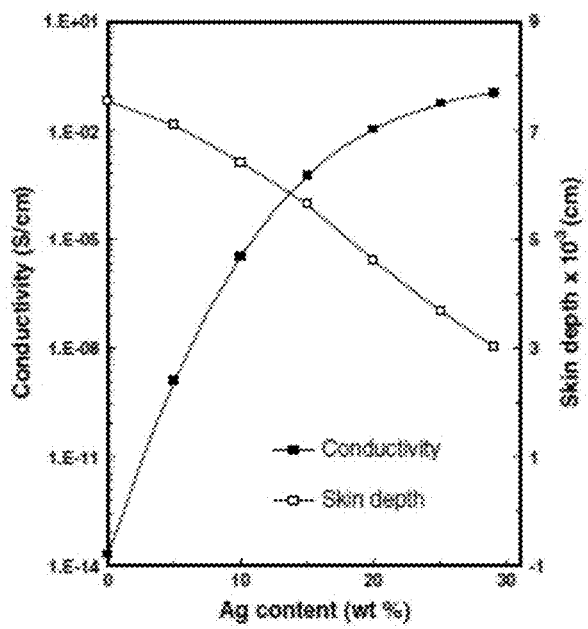
FIG. 10 illustrates the effect of wt % Ag content in PVA/Ag nanocomposites on conductivity and skin depth at 1 GHz.
Figure 11:
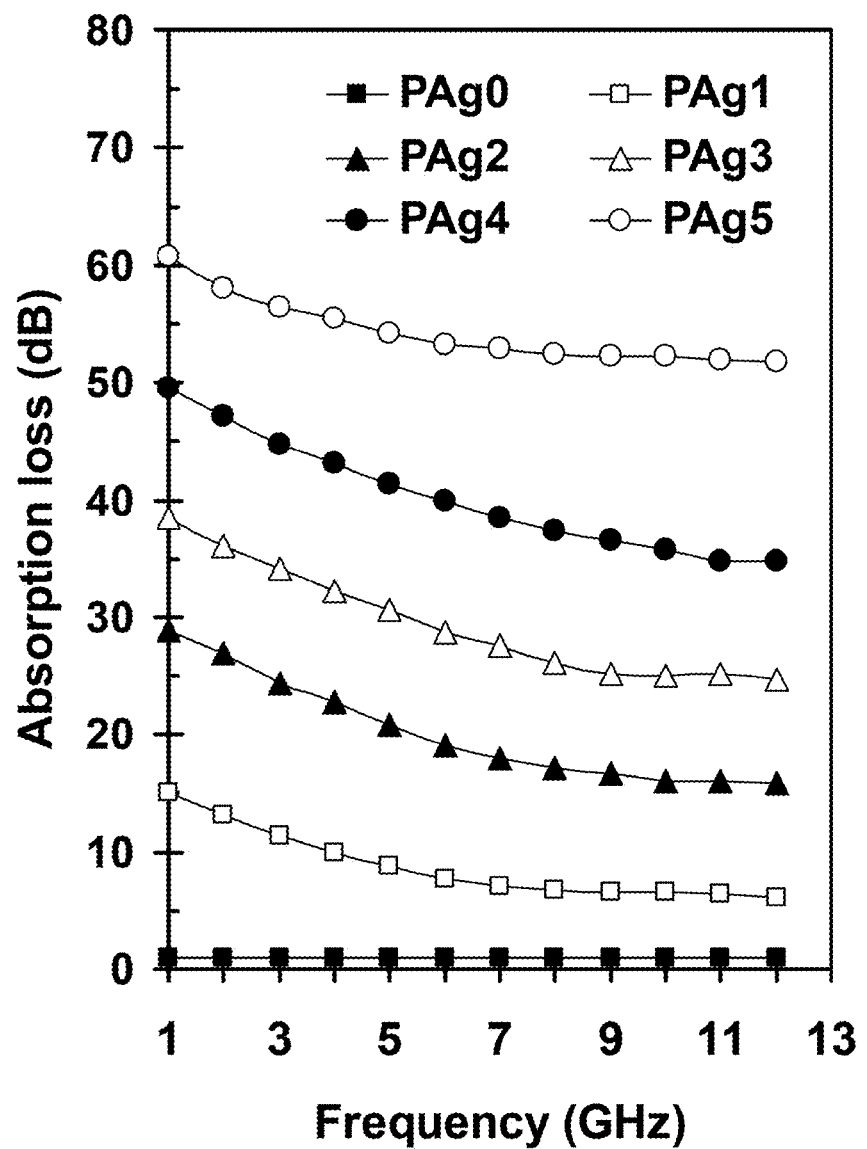
FIG. 11 illustrates the effect of frequency and wt % Ag content in PVA/Ag nanocomposites on electromagnetic absorption loss.
Figure 12:
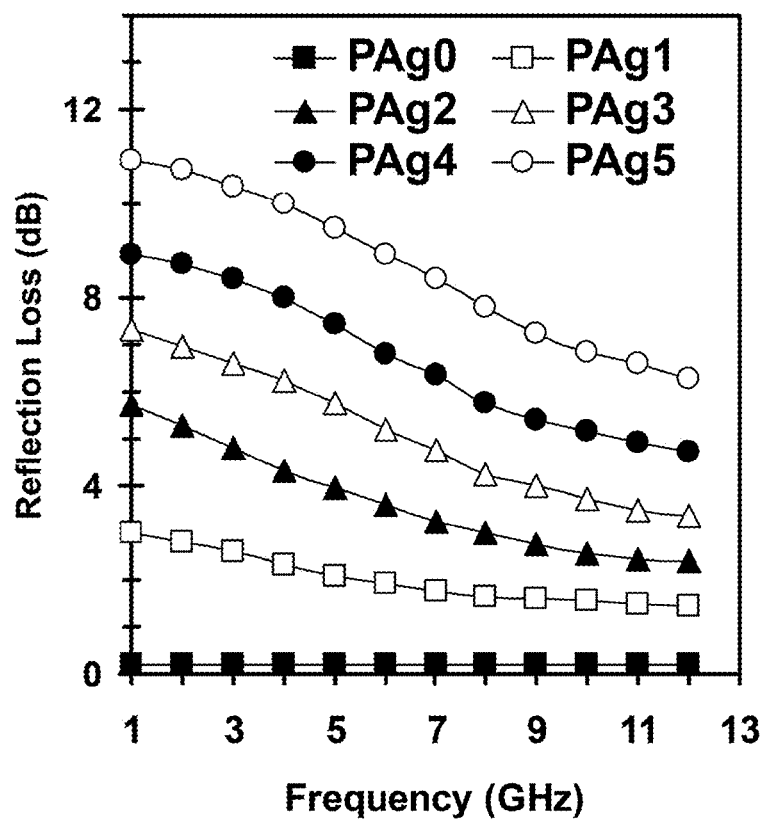
FIG. 12 illustrates the effect of frequency and wt % Ag content in PVA/Ag nanocomposites on electromagnetic reflection loss.

M is often considered negligible when A≥15 dB and/or when the distance between the reflecting surfaces or interfaces is large compared to the skin depth ($\delta$). Skin depth in meters is defined as $\delta=1/\sqrt{\pi f \sigma_r \mu}$ where f is the frequency and $\mu$ is related to the relative magnetic permeability ($\mu_r$) by $\mu=\mu_0\mu_r$, where $\mu_0$ is the absolute permeability of free space (air) equal to $4\pi \times 10^{-7}$. For plane wave radiation, R and A may also be calculated from: R=108+log [$\sigma/(\mu f)$] and A=1.33$\sqrt{\mu \sigma f}$, where t is the thickness of the sample. FIG. 10 presents the electrical conductivity and skin depth ($\delta$) as a function of Ag content for PVA/Ag nanocomposites at 1 GHz.

The target value of SE needed for commercial applications is around 20 dB. At a specific frequency, the SE increased with the increasing of the Ag nanoparticle content in the PVA/Ag nanocomposites. The main contribution to the SE is from the loadings of the Ag conducting nanoparticles. The enhanced SE is attributed to the formation of conductive bridges and uniform wide dispersion of Ag in the PVA polymer matrix (confirmed by the TEM image in FIG. 5) allowing interaction with the incident radiation and leading to a higher SE.

Figure 13:
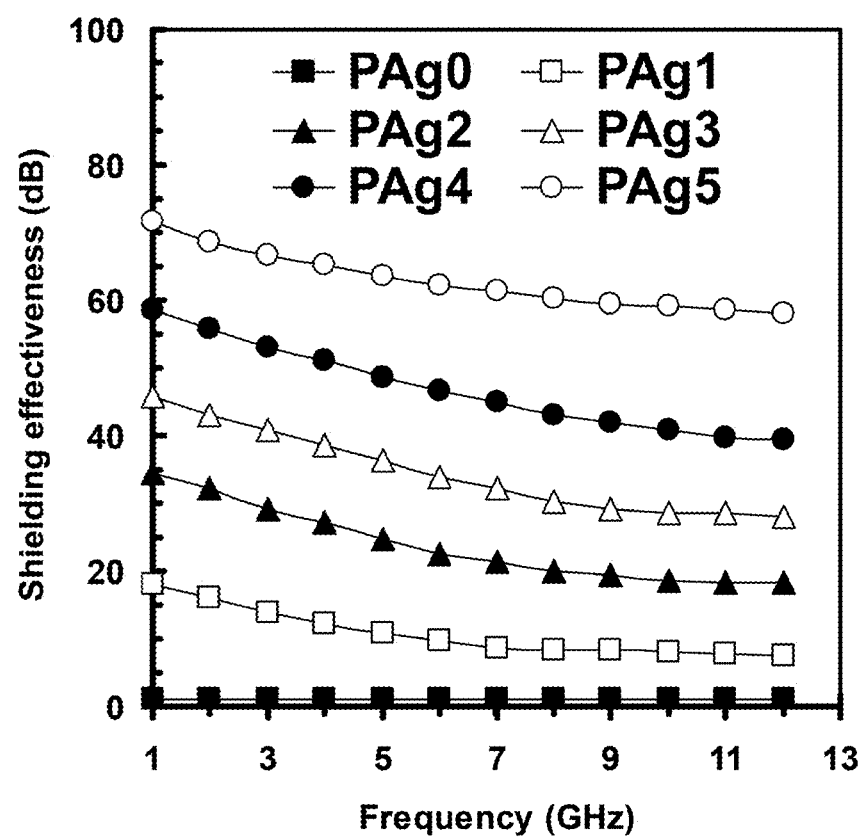
FIG. 13 illustrates the effect of frequency and wt % Ag content in PVA/Ag nanocomposites on measured electromagnetic shielding effectiveness.
Figure 14:
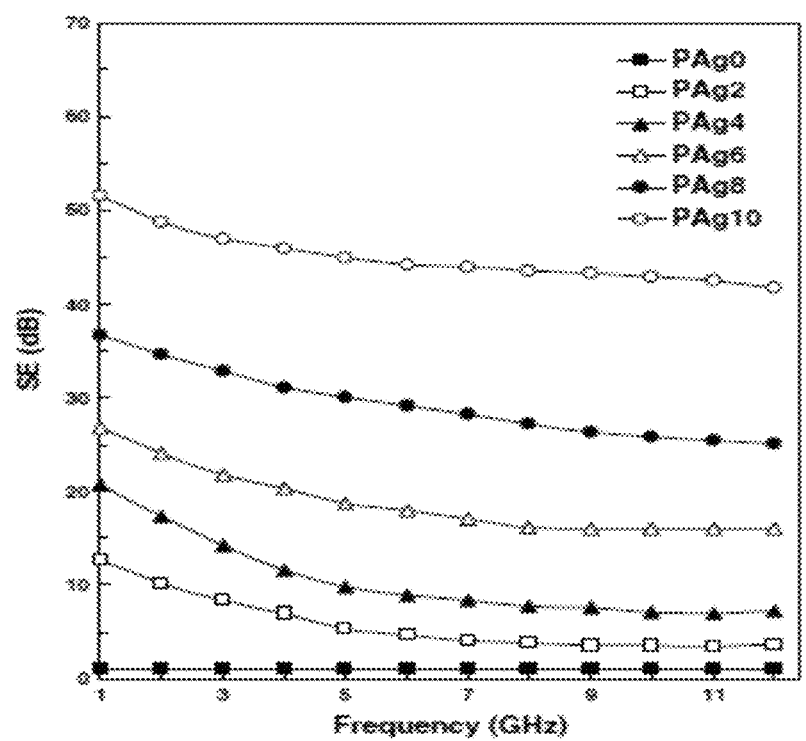
FIG. 14 illustrates the effect of frequency and wt % Ag content in PVA/Ag nanocomposites on measured total electromagnetic shielding effectiveness.

FIG. 13 demonstrates the nanocomposites exhibited 73 dB at 1 GHz dependent on Ag loading level. The high shielding effectiveness of PVA/Ag nanocomposites at high loading level at 1 GHz can be attributed to the high aspect ratio and the large skin depth of nanocomposites. The PVA/Ag nancocomposites can meet the demands of commercial applications.

The skin depth decreases significantly with the increases in Ag content into PVA/Ag nanocomposites as demonstrated in FIG. 10.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A nanocomposite shielding material, comprising;
a polyvinyl alcohol matrix,
silver nanoplatelets dispersed in the matrix,
wherein the nanocomposite shielding material absorbs electromagnetic radiation at a frequency of 1-12GHz, and
wherein the silver nanoplatelets have a thickness of 4-8 nm and an average edge length of 2-8 μm.

2. The nanocomposite shielding material of claim 1, which comprises from 1-10 weight percent silver nanoplatelets relative to the total weight of the nanocomposite shielding material.

3. The nanocomposite shielding material of claim 2, wherein the silver nanoplatelets form seamlessly interconnected infinite conductive networks with a separation of no more than 0.01-100 μm.

4. The nanocomposite shielding material of claim 3, which has a tensile strength of 20-50 MPa, a Young's modulus of 2-30 MPa, a hardness shore A of 30-70 MPa and an elongation at break of 90-5%.

5. The nanocomposite shielding material of claim 3, which has a conductivity of $10^{-14}$-$10^4$ $ohm^{-1}cm^{-1}$ and has a percolation threshold of 1.0-2.0 weight percent silver nanoplatelets relative to the total weight of the nanocomposite shielding material.

6. The nanocomposite shielding material of claim 3, which has a dielectric constant of 1-85.

7. The nanocomposite shielding material of claim 3, which has an electromagnetic absorption loss of 5-65 dB and an electromagnetic reflection loss of 1-20 dB.

8. The nanocomposite shielding material of claim 3, which has an electromagnetic shielding effectiveness, which is the sum of the absorption loss and the reflection loss, of 6-85 dB.

9. A process for forming the nanocomposite shielding material of claim 1, comprising;
dissolving polyvinyl alcohol in deionized water to form a polyvinyl alcohol solution and bubbling nitrogen gas into the polyvinyl alcohol solution, then
adding a solution of a silver salt precursor in distilled water to the polyvinyl alcohol solution and stirring to form a reaction mixture, then
adding a reducing agent to the reaction mixture and stirring, then
ultrasonically irradiating the reaction mixture to form a reduced reaction mixture, then
cooling the reduced reaction mixture and centrifuging with distilled water to obtain a polyvinyl alcohol silver nanocomposite solution, then
casting the polyvinyl alcohol silver nanocomposite solution and drying.

10. The process of claim 9, wherein the silver salt precursor is $AgNO_3$.

11. The process of claim 9, wherein the reducing agent is β-$_D$-Glucose.

12. An electronic device comprising the nanocomposite shielding material of claim 1, wherein the nanocomposite shielding material is present in or on said electronic device.

* * * * *